(12) United States Patent
Mair

(10) Patent No.: US 10,787,323 B2
(45) Date of Patent: Sep. 29, 2020

(54) APPARATUS AND METHOD FOR VIBRATION MEASUREMENT ON A MACHINE

(71) Applicant: Prüftechnik Dieter Busch AG, Ismaning (DE)

(72) Inventor: Christoph Mair, Munich (DE)

(73) Assignee: Prüftechnik Dieter Busch AG, Ismaning (DE)

( * ) Notice: Subject to any disclaimer, the term of this patent is extended or adjusted under 35 U.S.C. 154(b) by 252 days.

(21) Appl. No.: 15/977,592

(22) Filed: May 11, 2018

(65) Prior Publication Data

US 2018/0327199 A1 Nov. 15, 2018

(30) Foreign Application Priority Data

May 15, 2017 (DE) .......................... 10 2017 110 475

(51) Int. Cl.
| | | |
|---|---|---|
| *G01R 33/09* | (2006.01) | |
| *B65G 47/91* | (2006.01) | |
| *G01R 33/07* | (2006.01) | |
| *H01F 7/02* | (2006.01) | |
| *H01F 7/20* | (2006.01) | |

(52) U.S. Cl.
CPC ............. *B65G 47/91* (2013.01); *G01R 33/07* (2013.01); *G01R 33/072* (2013.01); *G01R 33/091* (2013.01); *H01F 7/0252* (2013.01); *B65G 2203/042* (2013.01); *H01F 2007/208* (2013.01)

(58) Field of Classification Search
CPC ...... G01R 33/072; G01R 33/07; H01F 7/0252
See application file for complete search history.

(56) References Cited

U.S. PATENT DOCUMENTS

| | | |
|---|---|---|
| 5,642,089 A | 6/1997 | Lysen |
| 5,726,911 A | 3/1998 | Canada et al. |
| 5,945,603 A | 8/1999 | Shih |
| 6,357,101 B1 | 3/2002 | Sarh et al. |
| 6,598,479 B1 | 7/2003 | Robinson et al. |
| 6,892,581 B2 | 5/2005 | Robinson et al. |
| 8,390,271 B2 | 3/2013 | Cardone et al. |
| 9,281,108 B2 | 3/2016 | Sarh et al. |
| 2011/0113888 A1* | 5/2011 | Busch .................. G01B 11/272 73/655 |
| 2013/0042682 A1* | 2/2013 | Busch .................... G01H 1/003 73/504.12 |

(Continued)

FOREIGN PATENT DOCUMENTS

| | | |
|---|---|---|
| CN | 2319893 Y | 5/1999 |
| CN | 201432301 Y | 3/2010 |

(Continued)

*Primary Examiner* — Alvaro E Fortich
(74) *Attorney, Agent, or Firm* — Barlow, Josephs & Holmes, Ltd.

(57) ABSTRACT

The invention relates to an apparatus for vibration measurement on a machine, having a base plate for mounting on a measurement point of the machine, a magnetic retaining device for holding the base plate at the measurement point by magnetic force, a sensor for detecting vibrations, arranged on or in contact with the base plate, a sensor for detecting the magnetic flux density in the area of the retaining device, and a monitoring device for monitoring the coupling of the base plate to the measurement point by evaluating the detected magnetic flux density.

17 Claims, 2 Drawing Sheets

(56) References Cited

U.S. PATENT DOCUMENTS

Figure 1:
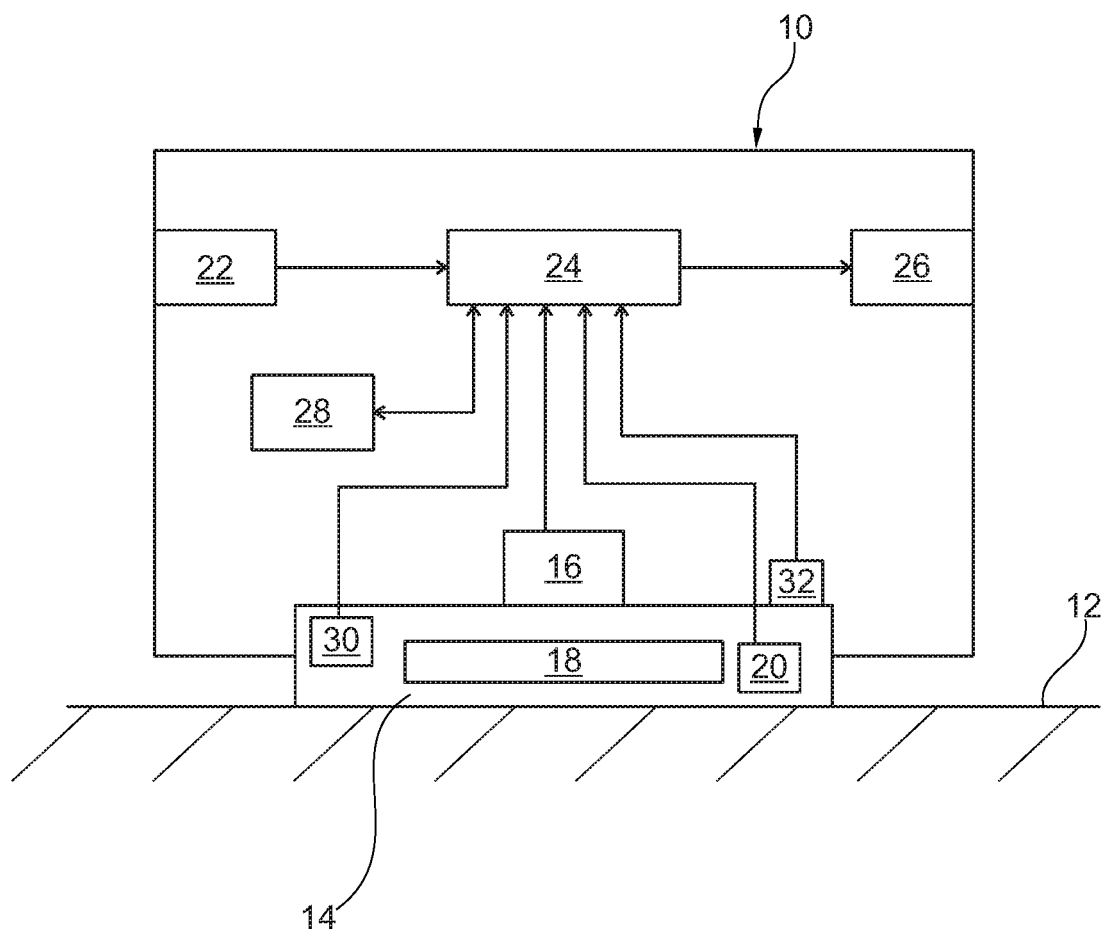

| | | | | |
|---|---|---|---|---|
| 2013/0276541 A1* | 10/2013 | Busch | ............... | G01H 11/08 |
| | | | | 73/649 |
| 2014/0090472 A1* | 4/2014 | Lysen | ............... | F03D 7/0296 |
| | | | | 73/587 |
| 2016/0041288 A1* | 2/2016 | Backes | ............ | H03K 17/9505 |
| | | | | 335/205 |
| 2016/0245878 A1* | 8/2016 | Hwang | ............ | G01R 33/0005 |
| 2017/0205293 A1* | 7/2017 | Lysen | ............... | G01K 1/143 |

FOREIGN PATENT DOCUMENTS

| | | |
|---|---|---|
| CN | 203579285 U | 5/2014 |
| DE | 2830269 C2 | 4/1988 |
| DE | 10106060 A1 | 9/2001 |
| DE | 60213252 T2 | 7/2007 |
| DE | 102012014277 A1 | 2/2013 |
| DE | 112013004264 T5 | 6/2015 |
| DE | 102014217706 A1 | 3/2016 |
| JP | 2006224261 A | 8/2006 |
| JP | 2010151773 A | 7/2010 |
| WO | 9703912 A1 | 2/1997 |
| WO | 03009972 A2 | 2/2003 |

\* cited by examiner

APPARATUS AND METHOD FOR VIBRATION MEASUREMENT ON A MACHINE

BACKGROUND OF THE INVENTION

The invention relates to an apparatus and a method for the measurement of vibrations on a machine.

Vibration measurements are an integral part of the condition monitoring of machines. When performing a vibration measurement, a base plate, on which a vibration sensor is arranged, is typically mounted on a measurement point of a machine, and a magnetic retaining device in the form of permanent magnets or electromagnets can be provided to hold the base plate at the measurement point by magnetic force during the vibration measurement. Examples of such vibration measuring devices are disclosed in U.S. Pat. No. 5,642,089, DE 10 2014 217 706 A1, DE 101 06 060 A1, U.S. Pat. Nos. 6,598,479 B1, 5,945,603 and 6,892,581 B1.

The adhesion of the sensor base plate to the machine measurement point is an essential factor for achieving reliable measurement results and can be influenced by factors such as contamination of the surfaces of the base plate or holding device (for example, by iron filings or grease residues), rough machine surfaces (caused, for example, by paint, dirt, casting processes, etc.) or the presence of foreign bodies between the base plate and the machine surface.

DE 11 2013 004 264 T5 discloses an electromagnetic or permanent-magnet based retaining device for workpieces, which has a magnetic sensor, for example a Hall-effect sensor, in order to measure the magnetic clamping force of the retaining device so as to monitor the secure and effective magnetic holding of workpieces.

WO 97/03912 A1 discloses a system for manoeuvring a magnetic load, wherein a detection coil is used to detect the magnetic flux prevailing in the air gap and from this the magnetic force acting on the magnetic load, in order to ensure secure manoeuvring.

WO 03/009972 A2 discloses a device for magnetically holding a workpiece, wherein a search coil is provided to supply a detection signal, which is representative of the magnetic flux, enabling the retaining force exerted on the workpiece to be determined, at least approximately. A similar magnetic retaining device is described in U.S. Pat. No. 9,281,108 B2, where a Hall-effect sensor is provided for measuring the magnetic flux density in the air gap, from which the current retaining force can be calculated.

Document U.S. Pat. No. 8,390,271 B2 relates to a magnetic retaining device with magnetic sensors for determining the current magnetic retaining force which acts on the workpiece, wherein the retaining force is indicated together with the weight of the workpiece, in order to ensure a secure lifting of the workpiece. Magnetic flux measurements are also used to determine which parts of the retaining device are under load. In doing so, such measurements also make use of reference values stored in the retaining device.

SUMMARY OF THE INVENTION

The object of the present invention is to create an apparatus and/or a method for vibration measurement on a machine with a magnetic retaining device, each of which ensures particularly reliable vibration measurements. A further object of the invention is to create a corresponding vibration measurement method.

These objects are achieved according to the invention by an apparatus according to the present invention.

An advantageous feature of the solution according to the invention is that the provision of a sensor for detecting the magnetic flux density in the area of the retaining device and a monitoring device for monitoring the coupling of the base plate to the measurement point by evaluating the detected magnetic flux density enables a poor coupling of the base plate to the measurement point, and thus any resulting unreliable vibration measurements, to be detected automatically and without delay, so that measurement errors, and the time wasted as a result, can be avoided, as can misinterpretations of measurements.

Preferred embodiments of the invention are discussed in detail herein.

BRIEF DESCRIPTION OF THE DRAWING FIGURES

In the following, preferred embodiments of the invention are explained in more detail by reference to examples shown in the accompanying drawings.

Figure 2:
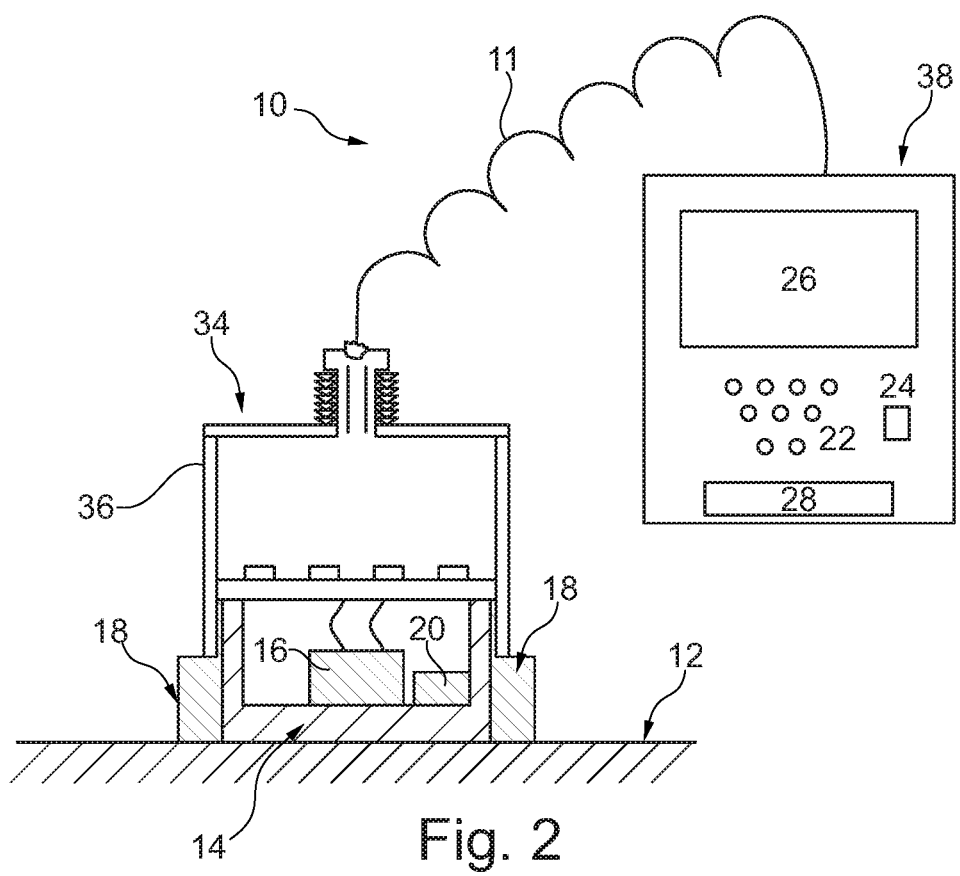
Figure 3:
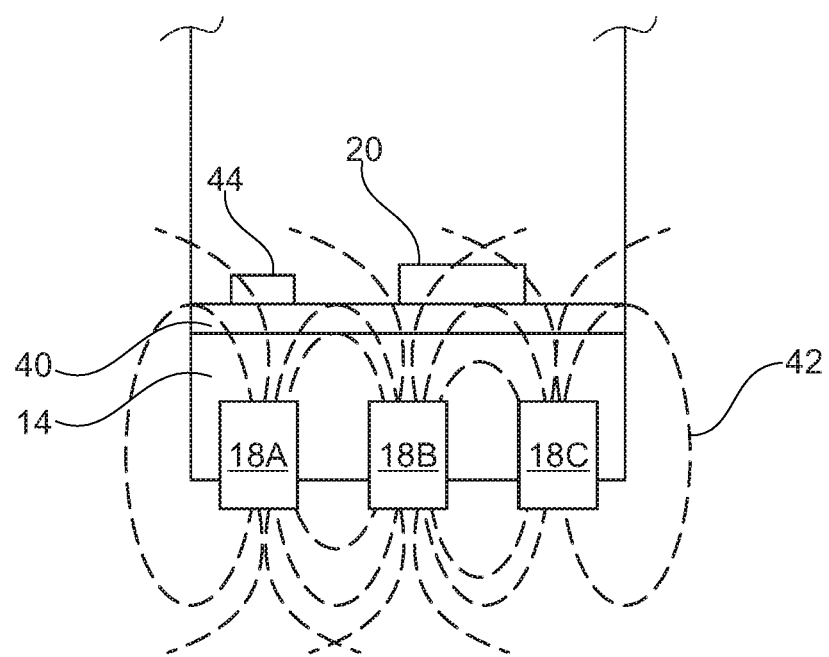

These show:

FIG. 1 a schematic block diagram of an example of the functional components of a vibration measurement apparatus according to the invention;

FIG. 2 a schematic representation of an example of an apparatus for vibration measurement, wherein the apparatus comprises a measuring head mounted on a machine and a measuring instrument connected to the measuring head; and FIG. 3 a schematic example of an arrangement of a magnetic retaining device and a magnetic flux sensor.

DESCRIPTION OF THE INVENTION

FIGS. 1 and 2 show an example of a vibration measuring apparatus 10 according to the invention, which is designed for mounting onto a measurement point formed by a machine surface 12. The measuring apparatus 10 comprises a base plate 14 for mounting a vibration sensor 16, arranged on the base plate 14, onto the machine surface 12 for detecting vibrations of the base plate 14, which in turn is excited by vibrations of the machine surface 12, a magnetic retaining device 18 for holding the base plate at the measurement point on the machine surface 12 by magnetic forces, and a sensor 20 for detecting the magnetic flux density in the area of the retaining device 18. The measuring apparatus 10 also comprises an input device 22 for data inputs and inputs by the user, a data processing device 24, which is used to evaluate the data of the vibration sensor 16 and the flux density sensor 20 and to control the measuring device 10, and an output device 26 for outputting vibration measurement results.

The data processing unit 24 is also used for monitoring the coupling of the base plate 14 to the measurement point by the retaining device 18, by the evaluation of the magnetic flux density detected by the sensor 20 in the area of the retaining device 18. In the evaluation of the magnetic flux density detected by the sensor 20, the currently detected values of the magnetic flux density are preferably compared with reference values stored in a memory 28 of the measuring device 10.

Such reference values are conveniently determined under precisely defined optimum conditions for the coupling between the base plate 14 and the machine surface 12, for example, for a cleaned and therefore contamination-free surface of the base plate 14 or retaining device 18 and the machine, wherein a correct mounting of the retaining device 18 in or on the base plate 14 must also be ensured. For example, the reference values can also depend on whether the part of the machine on which the measuring device 10 is mounted is a running electric motor or a passively driven machine part. In addition, the reference values can also depend on whether or not the measuring apparatus 10 is currently mounted on a machine surface 12. In addition, the relationship between magnetic flux density at the retaining device 18 and the adhesion force mediated by the retaining device 18 can be determined empirically and stored in the memory 28.

The output device 26 is used not only to output the results of the vibration measurements, but also to output results of the monitoring of the coupling of the base plate 18 to the machine surface 12. The output device 26 can thus issue a warning signal, for example, if the data processing device 24 has determined that there is inadequate coupling, for example, because the currently detected magnetic flux density is below a specified threshold (typically empirically determined).

By appropriate comparison with the stored reference values, the data processing device 24 can also determine whether or not the base plate 14 is currently being held on a machine surface 12, whether the base plate 14 is currently held on a running electric motor or on a passively driven machine part, and/or how large the retaining force is, with which the base plate 14 is currently being held on the machine surface 12.

To support the flux density sensor 20, the measuring apparatus 10 can additionally comprise a gyroscope 30 to detect movements, in particular tilting movements, of the base plate 14, wherein the data processing device 24 takes into account the movements of the base plate detected by the gyroscope 30 in determining the magnetic retaining force. In addition, the measuring apparatus 10 can comprise a three-axis acceleration sensor 32 or an inclinometer, to determine the orientation of the base plate 14 (and therefore of the vibration sensor 16) during the vibration measurement.

Furthermore, the flux density determined by the sensor 20 can also be used to assess the condition of the measuring apparatus 10 when it is not mounted on the machine surface 12. To do this, from the measured magnetic flux density it is possible, for example, to determine the degree of contamination of the retaining device 18 with magnetic particles, or to monitor whether the retaining device 18 is correctly mounted on the base plate 14 (this can be, for example, during and/or after the production of the measuring device 10 or after disassembly for cleaning).

In accordance with one example, the magnetic flux density signal can be recorded over time, and wherein the temporal course is then evaluated by spectral analysis in order to distinguish between the static retaining force of the magnetic retaining device 18 and external alternating magnetic fields, generated e.g. by an AC electric motor.

The flux density sensor 20 is preferably a multi-axis sensor. In particular, the sensor 20 can be implemented, for example, as a Hall-effect sensor, as an induction coil or as a GMR (giant magnetic resistance) sensor.

FIG. 2 shows a schematic example of a possible spatial arrangement or partitioning of the essential components of the measuring device 10 shown in FIG. 1, wherein the measuring device 10 comprises a measuring head 34 with a housing 36, and a measuring instrument 38 connected to the measuring head 34 by a wired or wireless connection 11. In this case, the base plate 14, the magnetic retaining device 18, the vibration sensor 16 and the sensor 20 are provided for detecting the magnetic flux density in the measuring head 34, while the monitoring device 24, the output device 26, the memory 28 as well as the input device 22 are provided in the measuring instrument 38. The magnetic holding device 18 can be arranged, for example, to the side of the base plate 14, while the magnetic sensor 20 is arranged on the base plate 14 near to the vibration sensor 16.

FIG. 3 shows an alternative example of the arrangement of the magnetic retaining device 18 and the magnetic sensor 20, in which a plurality of magnets 18A, 18B, 18C are arranged next to each other in the base plate 14 and the magnetic sensor 20 is provided on the printed circuit board 40 provided above the base plate 14. Alternatively, the magnetic sensor 20 can also be placed, for example, at the upper end of the housing. In principle, a plurality of magnetic sensors 20 can also be used, e.g. one per magnet. The important point is that the sensor can detect the magnetic field lines 42. The evaluation of the measurement results of the magnetic field sensor 20 can be performed directly afterwards by a micro-controller 44, or as in FIG. 2, in a downstream measuring instrument 38. Depending on the placement of the magnetic sensor 20, it should be able to measure along one or along a plurality of axes.

It would be appreciated by those skilled in the art that various changes and modifications can be made to the illustrated embodiments without departing from the spirit of the present invention. All such modifications and changes are intended to be covered by the appended claims.

What is claimed is:

1. An apparatus for vibration measurement on a machine, comprising:
   a base plate for mounting at a measurement point of the machine;
   a magnetic retaining device for holding the base plate at the measurement point by magnetic force;
   a sensor arranged on or in contact with the base plate for detecting vibrations;
   a sensor for detecting a magnetic flux density in the area of the retaining device; and
   a monitoring device for monitoring a coupling of the base plate to the measurement point by evaluating the detected magnetic flux density.

2. The apparatus according to claim 1, wherein the sensor detects the magnetic flux density in multiple axes to detect the magnetic flux density in at least two spatial directions.

3. The apparatus according to claim 1, wherein the monitoring device stores reference values for the magnetic flux density, to compare a currently collected values of the magnetic flux density with stored reference values and to evaluate the currently detected values of the magnetic flux density.

4. The apparatus according to claim 1, wherein an output device outputs results of the monitoring device to a user.

5. The apparatus according to claim 4, wherein the output device outputs a warning signal if the monitoring device determines an inadequate coupling when a currently detected magnetic flux density is below a specified threshold.

6. The apparatus according to claim 1, wherein the monitoring device detects from a currently detected value of the magnetic flux density whether or not the base plate is being held at the measurement point.

7. The apparatus according to claim 1, wherein the monitoring device detects from a currently detected value of the magnetic flux density whether or not the base plate is being held on a running electric motor or on a passively operated machine part.

8. The apparatus according to claim 1, wherein the monitoring device determines from a currently detected value of the magnetic flux density a retaining force with which the base plate is held at the measurement point.

9. The apparatus according to claim 1, wherein a gyroscope, in order to detect movements of the base plate, and wherein the monitoring device takes into account the movements of the base plate detected by the gyroscope in the determination of a retaining force.

10. The apparatus according to claim 1, wherein a three-axis acceleration sensor or an inclinometer determines an orientation of the base plate.

11. The apparatus according to claim 1, wherein the monitoring device detects a degree of contamination of the retaining device with magnetic particles when the base plate is not mounted at the measurement point.

12. The apparatus according to claim 1, wherein the monitoring device verifies whether the retaining device is correctly mounted on the base plate, wherein the base plate is not mounted at the measurement point.

13. The apparatus according to claim 1, wherein the sensor for detecting the magnetic flux density is an induction coil, a Hall-effect sensor or a GMR sensor.

14. The apparatus according to claim 1, wherein the measuring apparatus comprises a measuring head with a housing, and a measuring instrument, which is connected to the measuring head by a wired or wireless connection, wherein the base plate, the magnetic retaining device, the vibration sensor and the sensor for detecting the magnetic flux density form part of the measuring head and the monitoring device forms part of the measuring instrument, and wherein the measuring instrument additionally has an output device, a memory and an input device.

15. A method for vibration measurement on a machine, comprising the steps of:
   mounting a base plate with a vibration sensor at a measurement point of the machine and holding the base plate at the measurement point by a magnetic retaining device by magnetic force;
   detecting a magnetic flux density in the area of the retaining device; and
   monitoring coupling of the base plate to the measurement point by evaluating the magnetic flux density detected.

16. The method according to claim 15, wherein reference values for the magnetic flux density are determined under specific pre-defined conditions, the reference values are saved, currently detected values of the magnetic flux density are compared with stored reference values, and the currently detected values of the magnetic flux density are evaluated.

17. The method according to claim 15, wherein a magnetic flux density signal is recorded over time, and wherein a temporal course of the magnetic flux density signal is evaluated by means of spectral analysis, in order to distinguish between a static retaining force of the magnetic retaining device and externally generated alternating magnetic fields.

* * * * *